(12) United States Patent
Tomikawa et al.

(10) Patent No.: US 10,483,345 B2
(45) Date of Patent: Nov. 19, 2019

(54) ELECTRONIC COMPONENT EMBEDDED SUBSTRATE

(71) Applicant: TDK CORPORATION, Tokyo (JP)

(72) Inventors: Mitsuhiro Tomikawa, Tokyo (JP); Koichi Tsunoda, Tokyo (JP); Kazuhiro Yoshikawa, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/891,637

(22) Filed: Feb. 8, 2018

(65) Prior Publication Data

US 2018/0233553 A1 Aug. 16, 2018

(30) Foreign Application Priority Data

Feb. 13, 2017 (JP) .................................. 2017-024158

(51) Int. Cl.
*H01G 4/33* (2006.01)
*H01G 4/228* (2006.01)
*H01L 49/02* (2006.01)
*H01G 4/30* (2006.01)

(52) U.S. Cl.
CPC ............. *H01L 28/60* (2013.01); *H01G 4/228* (2013.01); *H01G 4/306* (2013.01); *H01G 4/33* (2013.01)

(58) Field of Classification Search
CPC ............. H01G 4/30; H01G 4/228; H01G 4/33
See application file for complete search history.

(56) References Cited

U.S. PATENT DOCUMENTS

| 5,633,181 | A | 5/1997 | Hayashi |
| 5,822,175 | A | 10/1998 | Azuma |
| 5,929,473 | A | 7/1999 | Nishihori et al. |
| 6,027,947 | A | 2/2000 | Evans et al. |
| 6,225,185 | B1 | 5/2001 | Yamazaki et al. |
| 2002/0102768 | A1 | 8/2002 | Shioga et al. |
| 2002/0122287 | A1 | 9/2002 | Mido et al. |
| 2004/0018693 | A1 | 1/2004 | Shioga et al. |

(Continued)

FOREIGN PATENT DOCUMENTS

| JP | H08-097310 A | 4/1996 |
| JP | H10-093041 A | 4/1998 |

(Continued)

*Primary Examiner* — Eric W Thomas
(74) *Attorney, Agent, or Firm* — Oliff PLC

(57) ABSTRACT

An electronic component embedded substrate includes: a substrate that includes an insulating layer and has a first principal surface and a second principal surface on the opposite side of the first principal surface; and an electronic component that is embedded in the substrate and has a plurality of first terminals provided close to the first principal surface, a plurality of second terminals provided close to the second principal surface, and a capacity part provided between the plurality of first terminals and the plurality of second terminals. The electronic component is configured such that at least a part of the second terminals is embedded in the insulating layer. An insulating member is provided between the neighboring second terminals to be in contact with both of the neighboring second terminals. The insulating member and the insulating layer are formed of materials whose thermal expansion coefficients are different from each other.

4 Claims, 11 Drawing Sheets

(56) References Cited

U.S. PATENT DOCUMENTS

| | | |
|---|---|---|
| 2004/0130849 A1 | 7/2004 | Kurihara et al. |
| 2005/0146838 A1 | 7/2005 | Shioga et al. |
| 2005/0156279 A1 | 7/2005 | Shioga et al. |
| 2006/0245139 A1 | 11/2006 | Kariya |
| 2006/0250749 A1 | 11/2006 | Kurihara et al. |
| 2007/0034989 A1 | 2/2007 | Shioga et al. |
| 2007/0139859 A1 | 6/2007 | Osaka et al. |
| 2007/0141800 A1 | 6/2007 | Kurihara et al. |
| 2008/0068780 A1 | 3/2008 | Shioga et al. |
| 2008/0145996 A1 | 6/2008 | Nomura et al. |
| 2008/0164563 A1 | 7/2008 | Nomura et al. |
| 2008/0315358 A1 | 12/2008 | Shioga et al. |
| 2009/0007405 A1 | 1/2009 | Shioga et al. |
| 2009/0201624 A1 | 8/2009 | Hattori et al. |
| 2010/0118468 A1 | 5/2010 | Nomura et al. |
| 2010/0246089 A1 | 9/2010 | Yano et al. |
| 2011/0044011 A1 | 2/2011 | Ohtsuka et al. |
| 2011/0075319 A1 | 3/2011 | Oikawa et al. |
| 2011/0110016 A1 | 5/2011 | Takeshima et al. |
| 2011/0128669 A1 | 6/2011 | Yano et al. |
| 2012/0104545 A1 | 5/2012 | Takeshima et al. |
| 2015/0062848 A1* | 3/2015 | Lee ............... H05K 1/0271 |
| | | 361/761 |
| 2016/0027579 A1 | 1/2016 | Kurachi et al. |
| 2016/0064473 A1 | 3/2016 | Morito et al. |

FOREIGN PATENT DOCUMENTS

| | | |
|---|---|---|
| JP | 2002-222925 A | 8/2002 |
| JP | 2004-214589 A | 7/2004 |
| JP | 2007-081325 A | 3/2007 |
| JP | 2008-277520 A | 11/2008 |
| JP | 2009-194096 A | 8/2009 |
| JP | 2010-225849 A | 10/2010 |
| JP | 2011-040571 A | 2/2011 |
| JP | 2011-077343 A | 4/2011 |
| JP | 2014-090077 A | 5/2014 |
| JP | 2016-167619 A | 9/2016 |

* cited by examiner

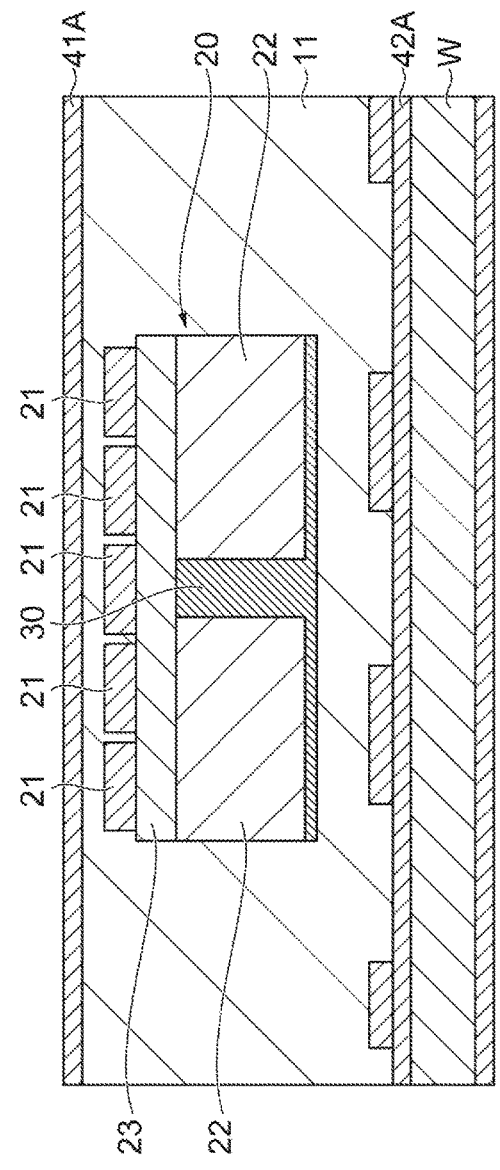
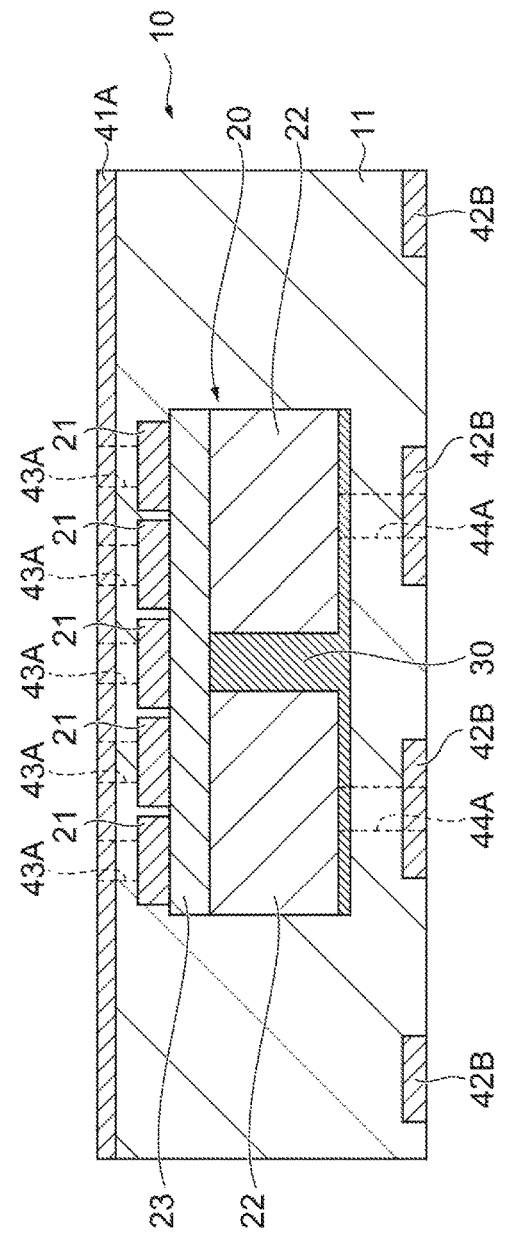

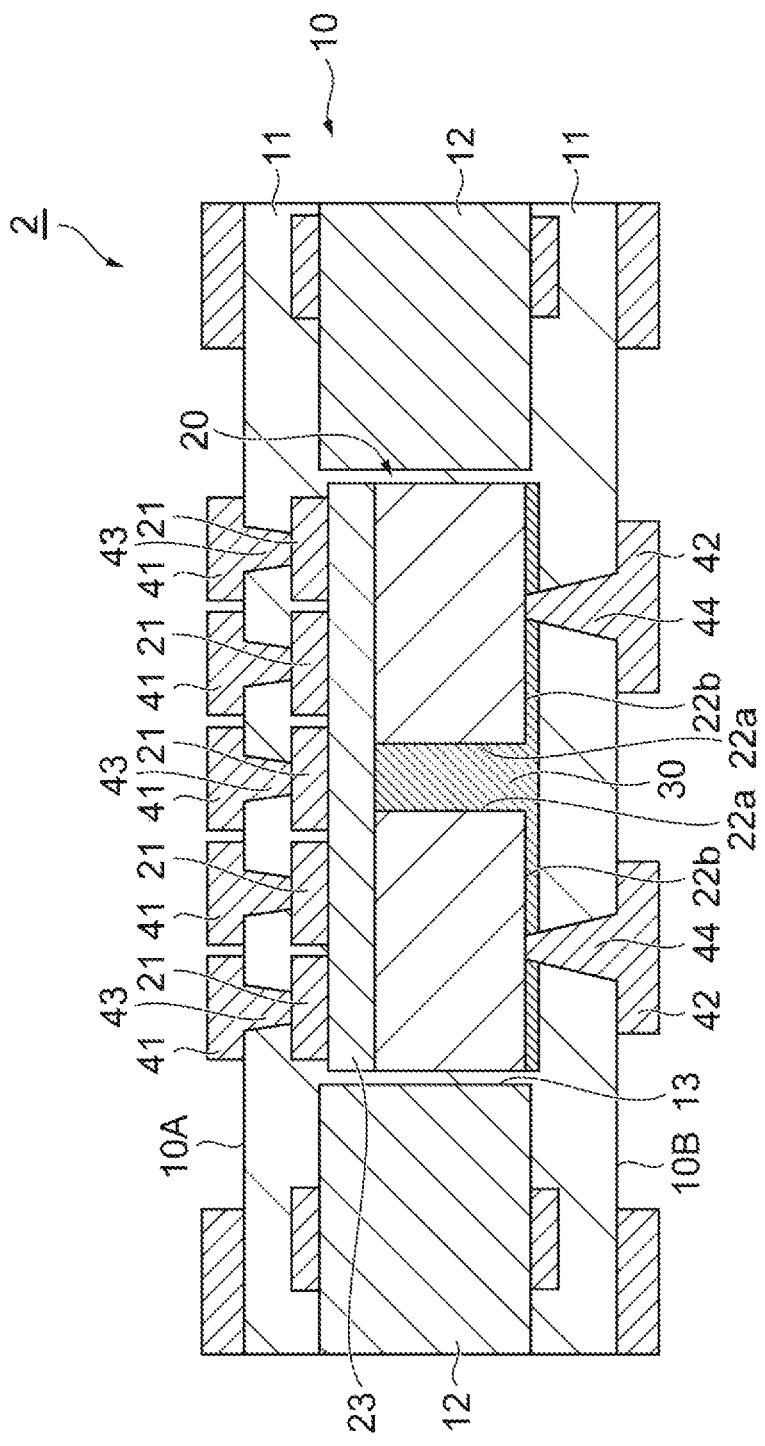

*Fig.7*
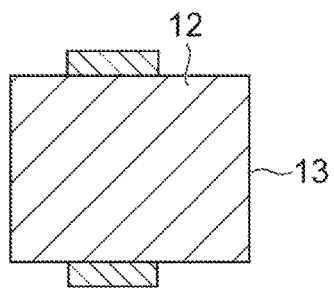
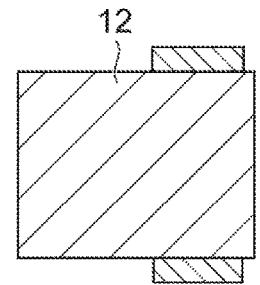

ELECTRONIC COMPONENT EMBEDDED SUBSTRATE

TECHNICAL FIELD

The present invention relates to an electronic component embedded substrate.

BACKGROUND

An electronic component embedded substrate with a thin film capacitor having a lower electrode, a dielectric thin film, and an upper electrode that faces the lower electrode across the dielectric thin film is described in Japanese Unexamined Patent Publication No. 2007-81325.

Meanwhile, the inventors of this application had considered dividing a lower electrode of such an electronic component (a thin film capacitor) into a plurality of parts in order to achieve low equivalent series inductance (ESL) in an electronic component embedded substrate in which the electronic component is embedded. However, when the lower electrode is divided into the plurality of parts, strength of the electronic component is lowered, and the electronic component may be damaged during handling or the like.

SUMMARY

The present invention was made in view of the above circumstances, and is directed to providing an electronic component embedded substrate capable of inhibiting damage to an electronic component.

To resolve the above problem, an electronic component embedded substrate according to an embodiment of the present invention includes: a substrate configured to include an insulating layer and to have a first principal surface and a second principal surface on the opposite side of the first principal surface; and an electronic component embedded in the substrate and configured to have a plurality of first terminals provided close to the first principal surface, a plurality of second terminals provided close to the second principal surface, and a capacity part provided between the plurality of first terminals and the plurality of second terminals. The electronic component is configured such that at least a part of the second terminals is embedded in the insulating layer. An insulating member is provided between the neighboring second terminals to be in contact with both the neighboring second terminals, and the insulating member and the insulating layer are formed of materials whose thermal expansion coefficients are different from each other.

In this electronic component embedded substrate, the electronic component has the plurality of second terminals, and the insulating member formed of a material whose thermal expansion coefficient is different from that of the insulating layer is provided to be in contact with both of the neighboring second terminals. Thereby, a reduction in strength of the electronic component can be inhibited. Accordingly, damage to the electronic component can be inhibited. The insulating member is provided between the neighboring second terminals, and thereby a short circuit between the second terminals can be inhibited.

In the electronic component embedded substrate according to an embodiment, the thermal expansion coefficient of the material of which the insulating member is formed may be smaller than that of the material of which the insulating layer is formed, and may be greater than that of a material of which the second terminals are formed. In this case, stress resulting from a difference between the thermal expansion coefficient of the material of which the insulating member is formed and the thermal expansion coefficient of the material of which the second terminals are formed can be relaxed by the insulating member. Accordingly, it is possible to inhibit the electronic component from being damaged by the stress in the electronic component embedded substrate.

In the electronic component embedded substrate according to an embodiment, the insulating member may be provided close to the second principal surface with respect to the second terminals. In this case, the reduction of the strength of the electronic component can be more reliably inhibited. Accordingly, the damage to the electronic component can be more reliably inhibited.

In the electronic component embedded substrate according to an embodiment, the substrate may further include a core embedded in the insulating layer, a through-hole passing from the first principal surface side to the second principal surface side may be provided in the core, and the electronic component may be disposed in the through-hole. In this case, a strength of the entire electronic component embedded substrate can be improved.

According to the present invention, an electronic component embedded substrate capable of inhibiting damage to an electronic component is provided.

BRIEF DESCRIPTION OF THE DRAWINGS

FIG. 5A is a view for describing the method for manufacturing the electronic component embedded substrate illustrated in FIG. 1.

FIG. 5B is a view for describing the method for manufacturing the electronic component embedded substrate illustrated in FIG. 1.

FIG. 6 is a sectional view schematically illustrating a part of an electronic component embedded substrate according to a second embodiment of the present invention.

FIG. 7 is a view for describing a method for manufacturing the electronic component embedded substrate illustrated in FIG. 6.

DETAILED DESCRIPTION

Hereinafter, various embodiments of the present invention will be described with reference to the drawings. In each of the drawings, identical or equivalent parts are given the same reference signs, and duplicate description thereof will be omitted.

First Embodiment

Figure 1:
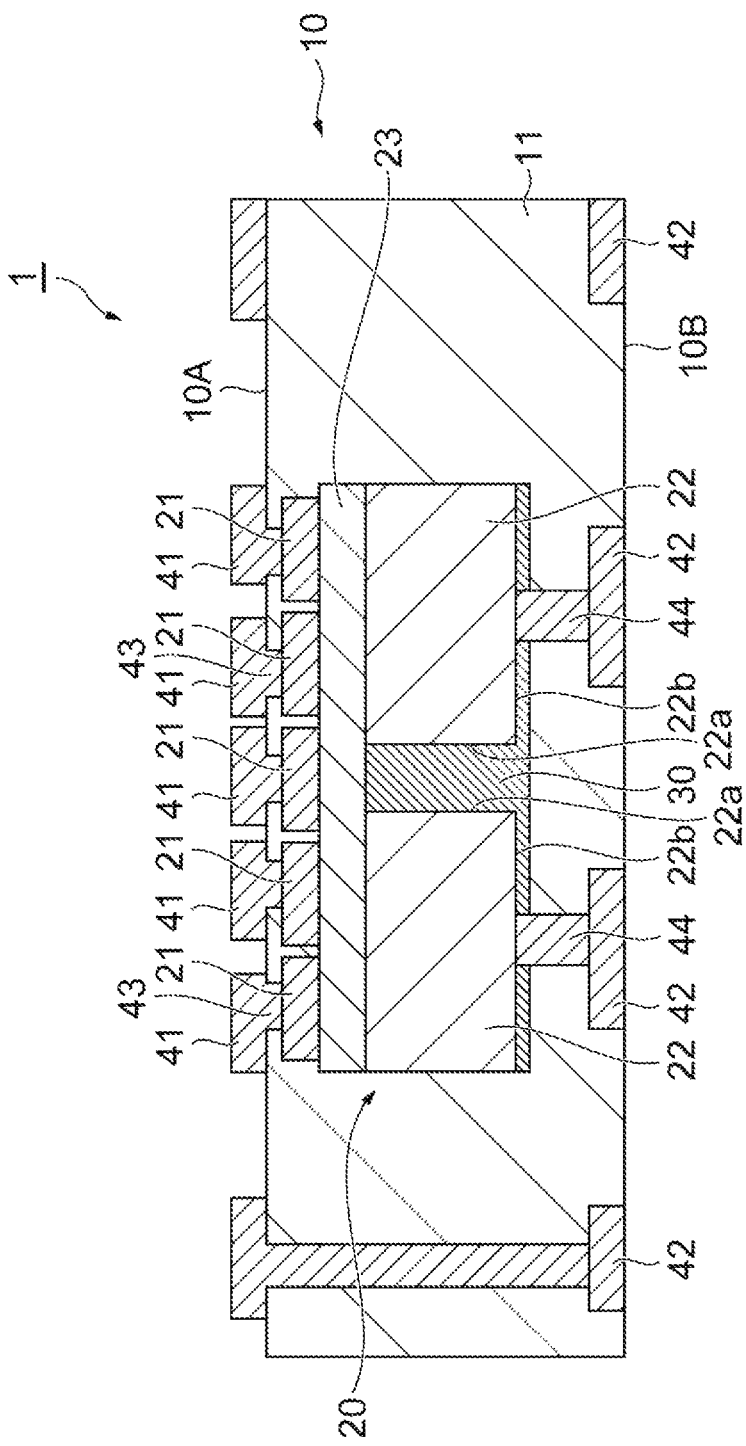
FIG. 1 is a sectional view schematically illustrating a part of an electronic component embedded substrate according to a first embodiment of the present invention.

FIG. 1 is a sectional view schematically illustrating a part of an electronic component embedded substrate according to a first embodiment of the present invention. An electronic component embedded substrate 1 illustrated in FIG. 1 is a substrate used in, for instance, a communication terminal or the like. As illustrated in FIG. 1, the electronic component embedded substrate 1 includes a substrate 10 having an insulating layer 11, an electronic component 20 embedded in the substrate 10, and an insulating member 30. The substrate 10 has a first principal surface 10A and a second principal surface 10B on the opposite side of the first principal surface 10A. The electronic component 20 has a plurality of first terminals 21 that are provided close to the first principal surface 10A, a plurality of second terminals 22 that are provided close to the second principal surface 10B, and a capacity part 23 that is provided between the first terminals 21 and the second terminals 22. The insulating member 30 is provided between the neighboring second terminals 22. The electronic component embedded substrate 1 includes first electrodes 41 that are electrically connected to the first terminals 21 of the electronic component 20, and second electrodes 42 that are electrically connected to the second terminals 22 of the electronic component 20. Here, when the electronic component 20 is said to be "embedded in" the substrate 10, it refers to a state in which the electronic component 20 is not exposed from the first and second principal surfaces 10A and 10B of the substrate 10.

The substrate 10 is a so-called multi-layered circuit substrate. In the present embodiment, the substrate 10 includes only the insulating layer 11, and the first and second principal surfaces 10A and 10B of the substrate 10 are equivalent to principal surfaces of the insulating layer 11. The insulating layer 11 is formed of, for instance, an insulating material such as an epoxy resin, an acrylic resin, a phenolic resin, or the like. The insulating material of which the insulating layer 11 is formed is preferably a material whose hardness is changed by specific treatment, such as a thermosetting resin or a photocurable resin. A whole thickness of the substrate 10 may be set to, for instance, about 40 µm to 1000 µm. A thickness of the insulating layer 11 may be set to, for instance, about 1 µm to 200 µm. The whole thickness of the substrate 10 and the thickness of the insulating layer 11 are not particularly limited.

The electronic component 20 is a capacitor having a plurality of first terminals 21, a plurality of second terminals 22, and a capacity part 23 provided between the plurality of first terminals 21 and the plurality of second terminals 22. In the present embodiment, a case in which the electronic component 20 is a so-called thin film capacitor (TFCP) in which the first terminals 21 and second terminals 22 are formed of a metal thin film and the capacity part 23 is formed of a dielectric film will be described. The electronic component 20 is disposed to be in a state in which at least some of the second terminals 22 are embedded in the insulating layer 11. Here, the expression "a state in which at least some of the second terminals 22 are embedded in the insulating layer 11" refers to a state in which some surrounding the second terminals 22 are covered with the insulating layer 11. The insulating member 30 may be interposed between the second terminals 22 and the insulating layer 11. In the present embodiment, the entire electronic component 20 is in a state in which it is embedded in the insulating layer 11. The first terminals 21 are divided to be, for example, five terminals, and the second terminals 22 are divided to be, for example, two terminals. Each of the divided second terminals 22 has an end face 22a that faces the neighboring second terminal, and an end face 22b close to the second principal surface 10B. The sum of thicknesses of the three layers (the first terminal 21, the second terminal 22, and the capacity part 23) of the electronic component 20 is, for instance, about 5 µm to 650 µm. The thickness of the first terminal 21 may be set to about 0.1 µm to 50 µm, the thickness of the capacity part 23 may be set to about 0.05 µm to 100 µm, and the thickness of the second terminals 22 may be set to about 5 µm to 500 µm.

As a material of which the first terminals 21 and the second terminals 22 are formed, a material whose principal component is nickel (Ni), copper (Cu), aluminum (Al), platinum (Pt), an alloy containing these metals, or an intermetallic compound is appropriately used. However, the materials of the first and second terminals 21 and 22 are not particularly limited as long as they are conductive materials. In the present embodiment, a case in which copper is used as the principal component of the first terminals 21 and nickel is used as the principal component of the second terminals 22 will be described. "Principal component" means that a percentage of the component is higher than or equal to 50 mass %. As a mode for the first terminals 21 and the second terminals 22, in addition to a case in which these terminals are formed of an alloy or an intermetallic compound, a case in which these terminals has a laminate structure formed of two or more layers is also included. For example, an electrode layer may be formed as a double-layered structure in which a Cu thin film is provided on a Ni thin film. When pure nickel is used for the first terminals 21 and/or the second terminals 22, a purity of the nickel is preferably 99.99% or higher. Further, in the case of the alloy containing nickel, a metal contained as a metal other than nickel preferably includes at least one selected from the group consisting of platinum (Pt), palladium (Pd), iridium (Ir), rhodium (Rh), ruthenium (Ru), osmium (Os), rhenium (Re), tungsten (W), chromium (Cr), tantalum (Ta), silver (Ag), and copper (Cu).

The capacity part 23 is formed of a perovskite-based dielectric material. Here, the perovskite-based dielectric material in the present embodiment includes a (strong) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, $Pb(Zr_xTi_{1-x})O_3$, or the like, a composite perovskite relaxer type ferroelectric material typified by $Pb(Mg_{1/3}Nb_{2/3})O_3$ or the like. Here, in the perovskite structure and the perovskite relaxer type dielectric material, a ratio between an A site and a B site is typically an integer ratio, but it may be intentionally shifted from an integer ratio in order to improve characteristics. For characteristic control of the capacity part 23, an additive acting as an accessory component may be appropriately contained in the capacity part 23.

The insulating member 30 is provided between the neighboring second terminals 22 of the electronic component 20. The insulating member 30 is provided to be in contact with and connect both of the neighboring second terminals 22. Further, the insulating member 30 is also provided close to the second principal surface 10B with respect to the second terminals 22. To be more specific, the insulating member 30 is filled between the neighboring second terminals 22 to connect the end face 22a of one of the second terminals 22 and the end face 22a of the other second terminal 22, and is provided to cover the end faces 22a of the two second terminals 22. As a result, the end faces 22a of the neighboring second terminals 22 are connected via the insulating member 30. The insulating member 30 and the insulating layer 11 are formed of materials having different thermal expansion coefficients from each other. The thermal expansion coefficient of the material of which the insulating member 30 is formed is smaller than that of the material of which the insulating layer 11 is formed, and is greater than that of the material of which the second terminals 22 are formed. For example, a polyimide resin may be used for the material of which the insulating member 30 is formed. In this case, for instance an epoxy resin is used for the insulating layer 11, and for instance nickel is used for the second terminals 22. As an example, the thermal expansion coefficient of the material of which the insulating member 30 is formed may be set to 15 ppm/° C. or more and 20 ppm/° C. or less, the thermal expansion coefficient of the material of which the insulating layer 11 is formed may be set to be more than 20 ppm/° C., and the thermal expansion coefficient for the second terminals 22 may be set to about 13 ppm/° C.

The first electrodes 41 are provided to correspond to the plurality of first terminals 21. In the present embodiment, an example in which five first electrodes 41 are provided is given. The first electrodes 41 are laminated with the first principal surface 10A of the substrate 10, and are electrically connected to the first terminals 21 by way of the via conductors 43 embedded in the insulating layer 11. The first terminals 21 of the electronic component 20 are configured to enable electrical connection with an external electronic component or a wiring by way of the via conductors 43 and the first electrodes 41. The first electrodes 41 and the via conductors 43 are formed of a conductive material such as, for instance, copper (Cu).

The second electrodes 42 are provided to correspond to the plurality of second terminals 22. In the present embodiment, an example in which two second electrodes 42 are provided is given. The second electrodes 42 are embedded in the insulating layer 11 (the substrate 10) to be exposed on the second principal surface 10B, and are electrically connected to the second terminals 22 by way of the via conductors 44. The via conductors 44 pass through the insulating member 30, and are electrically connected to the second terminals 22. The second terminals 22 of the electronic component 20 are configured to enable electrical connection with an external electronic component or a wiring via the via conductors 44 and the second electrodes 42. The second electrodes 42 are formed of a conductive material such as, for instance, copper (Cu). The second electrodes 42 may not be embedded in the insulating layer 11, and may be laminated with the second principal surface 10B.

Next, a method for manufacturing the electronic component embedded substrate 1 according to the present embodiment will be described with reference to FIGS. 2 to 5B. FIGS. 2 to 5B are views for describing a method for manufacturing the electronic component embedded substrate illustrated in FIG. 1. In FIGS. 2 to 5B, a method for manufacturing one electronic component embedded substrate 1 is illustrated. However, in practice, after a plurality of electronic component embedded substrates 1 are formed on a single support substrate, the electronic component embedded substrates 1 are individually segmented. Accordingly, FIGS. 2 to 5B are enlarged views illustrating a part on the single support substrate.

Figure 2:
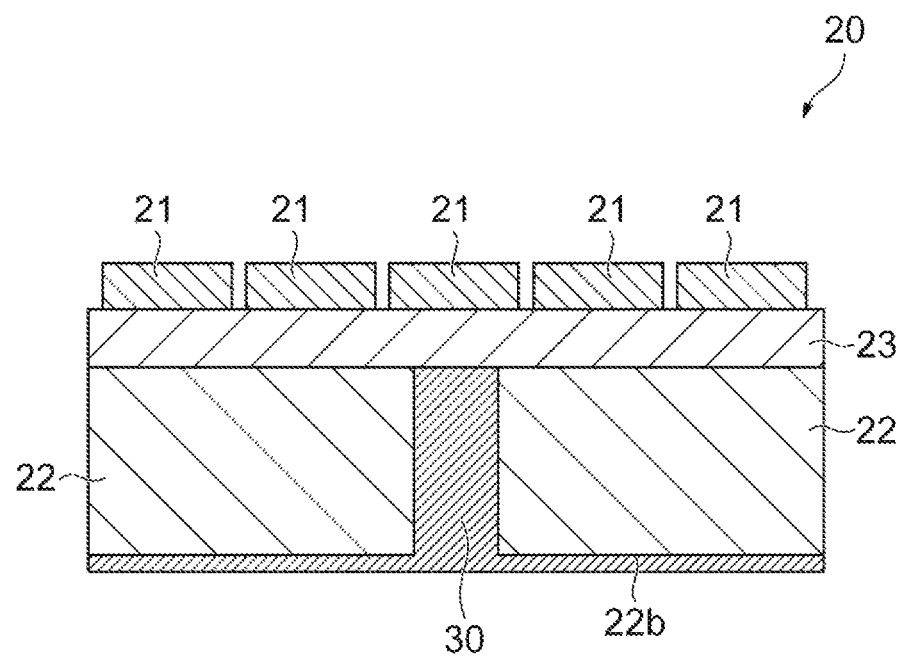
FIG. 2 is a view for describing a method for manufacturing the electronic component embedded substrate illustrated in FIG. 1.

First, as illustrated in FIG. 2, the electronic component 20 is prepared, and the insulating member 30 is formed between the neighboring second terminals 22 of the electronic component 20. The first terminals 21 of the electronic component 20 are divided to be five terminals, and the second terminals 22 are divided to be two terminals. The insulating member 30 is formed by applying a resin material in an uncured state to the sides of the second terminals 22 of the electronic component 20, and then curing the resin material. Thereby, the insulating member 30 is in a state in which it is filled between the neighboring second terminals 22, and the end faces 22b of the second terminals 22 are in a state in which they are covered with the insulating member 30.

Figure 3A:
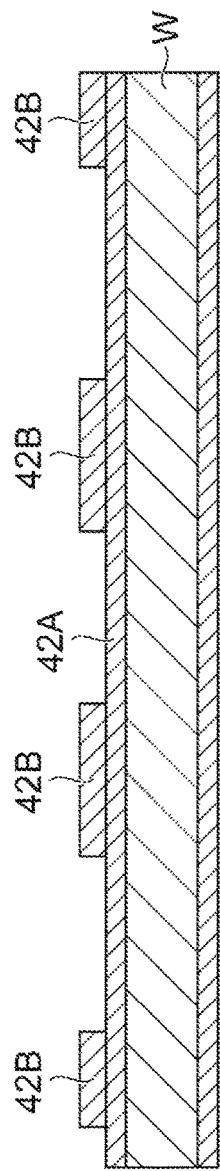
FIG. 3A is a view for describing the method for manufacturing the electronic component embedded substrate illustrated in FIG. 1.
Figure 3B:
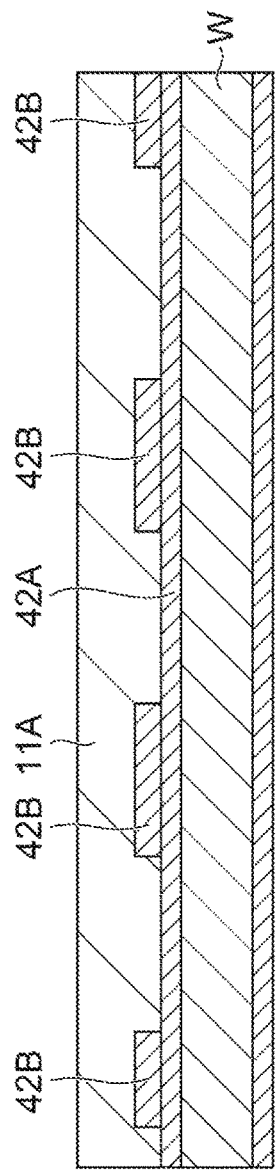
FIG. 3B is a view for describing the method for manufacturing the electronic component embedded substrate illustrated in FIG. 1.

Next, as illustrated in FIG. 3A, the support substrate W is prepared, and conductive layers 42A and 42B for forming the second electrodes 42 are formed on the support substrate W. The conductive layer 42B is formed on the conductive layer 42A to become a pattern corresponding to the second electrodes 42. For the formation of the conductive layers 42A and 42B, for example, a known process such as sputtering may be used. For patterning of the conductive layer 42B, for example, a known process such as etching is used. Afterward, as illustrated in FIG. 3B, a resin layer 11A becoming a part of the insulating layer 11 is formed on the conductive layers 42A and 42B. The resin layer 11A may be formed by, for instance, a film laminating method.

Figure 4:
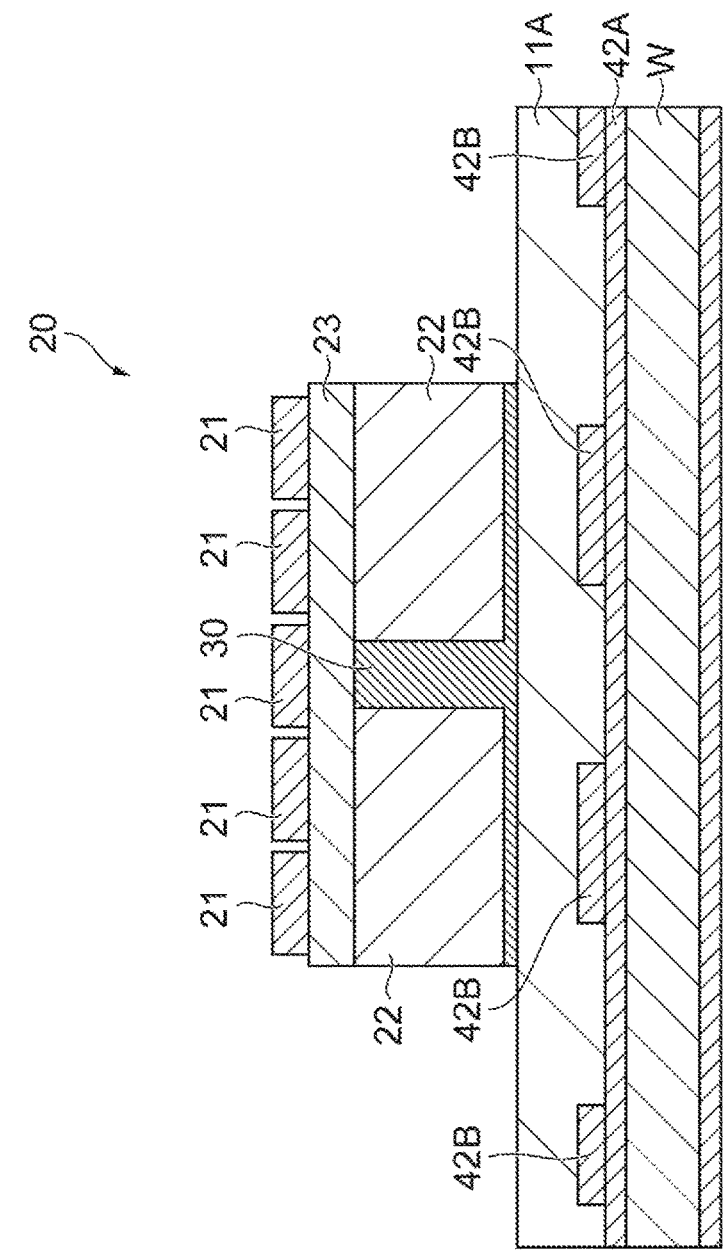
FIG. 4 is a view for describing the method for manufacturing the electronic component embedded substrate illustrated in FIG. 1.

Next, as illustrated in FIG. 4, the electronic component 20 is mounted on the resin layer 11A. At this time, positions of the second terminals 22 of the electronic component 20 are aligned to match a pattern of the conductive layer 42B.

Next, as illustrated in FIG. 5A, a resin is laminated to cover the electronic component 20. Thereby, the insulating layer 11 is formed, and the electronic component 20 is in a state in which it is embedded in the insulating layer 11. The lamination of the resin is performed by sticking and pressing, for instance, a resin in an uncured film form. Afterward, the conductive layer 41A becoming the first electrodes 41 is formed on the insulating layer 11.

Next, as illustrated in FIG. 5B, the support substrate W and the conductive layer 42A are removed. Thereby, the conductive layer 42B is in a state in which it is peeled off of the support substrate W and the conductive layer 42A, and the conductive layer 42B is in a state in which it is formed on the insulating layer 11 (on the second principal surface 10B of the substrate 10). Afterward, holes 43A and 44A for forming the via conductors 43 and 44 are formed. The holes 43A are formed in places corresponding to the first terminals 21 respectively, and pass through the insulating layer 11 between the conductive layer 41A and the first terminals 21. The holes 44A are formed in places corresponding to the second terminals 22 respectively, and pass through the insulating layer 11 and the insulating member 30 between the conductive layer 42B and the second terminals 22. The holes 43A and 44A may be formed by, for instance, laser ablation.

Finally, the via conductors 43 and 44 are formed in the holes 43A and 44A by plating or sputtering, and patterning of the conductive layer 41A is performed. Thereby, the plurality of first electrodes 41 and the plurality of second electrodes 42 are formed. Afterward, individual segmentation is performed by dicing or the like, and thereby the electronic component embedded substrate 1 illustrated in FIG. 1 is obtained.

As described above, in the electronic component embedded substrate 1, the electronic component 20 has the plurality of second terminals 22, and the insulating member 30 formed of a material having a thermal expansion coefficient different from that of the insulating layer 11 is provided between the neighboring second terminals 22. Thereby, in comparison with a case in which the insulating member 30 is not provided, the second terminals 22 can be held by the insulating member 30 to inhibit deformation of the electronic component 20 due to internal stress and an external force in the electronic component embedded substrate 1. Accordingly, a reduction in the strength of the electronic component 20 can be inhibited, and the damage to the electronic component 20 can be inhibited. The insulating member 30 is provided between the neighboring second terminals 22, and thereby a short circuit between the second terminals 22 can be inhibited.

When the insulating member 30 is provided, the damage to the electronic component 20 can be inhibited during handling in the process of manufacturing the electronic component embedded substrate 1.

The insulating member 30 is also provided on the side (the end faces 22b) of the second principal surface 10B with respect to the second terminals 22. Thereby, since the second terminals 22 and the insulating member 30 are also connected on the end faces 22b in addition to the end faces 22a, the second terminals 22 is more powerfully held by the insulating member 30. Accordingly, the reduction of the strength of the electronic component 20 can be more reliably inhibited, and the damage to the electronic component 20 can be more reliably inhibited.

The thermal expansion coefficient of the material of which the insulating member 30 is formed is smaller than that of the material of which the insulating layer 11 is formed, and is greater than that of the material of which the second terminals 22 are formed. In this way, the insulating member 30 is formed of a material that has a thermal expansion coefficient between the relatively great thermal expansion coefficient of the insulating layer 11 and the relatively small thermal expansion coefficient of the second terminal 22, and thereby stress resulting from a difference between the thermal expansion coefficient of the material of which the insulating layer 11 is formed and the thermal expansion coefficient of the material of which the second terminals 22 are formed can be relaxed. Accordingly, the damage to the electronic component 20 due to the stress in the electronic component embedded substrate 1 can be inhibited.

Second Embodiment

Next, an electronic component embedded substrate 2 according to a second embodiment of the present invention will be described with reference to FIG. 6. FIG. 6 is a sectional view schematically illustrating a part of an electronic component embedded substrate according to a second embodiment of the present invention. As illustrated in FIG. 6, like the electronic component embedded substrate 1, the electronic component embedded substrate 2 includes a substrate 10 including an insulating layer 11, an electronic component 20 embedded in the substrate 10, and an insulating member 30. The electronic component embedded substrate 2 is different from the electronic component embedded substrate 1 in which the substrate 10 further includes a core 12 embedded in the insulating layer 11. A through-hole 13 passing from a first principal surface 10A side to a second principal surface 10B side is provided in the core 12, and the electronic component 20 is disposed in the through-hole 13. The insulating layer 11 is filled in the through-hole 13, and the insulating layer 11 is interposed between the electronic component 20 and the core 12, so that second terminals 22 of the electronic component 20 are in a state in which they are embedded in the insulating layer 11. In the electronic component embedded substrate 2 as well, the first and second principal surfaces 10A and 10B of the substrate 10 are equivalent to principal surfaces of the insulating layer 11. The core 12 is formed of, for instance, a silicon (Si) substrate, a glass ($SiO_2$) substrate, or a resin substrate.

Figure 8:
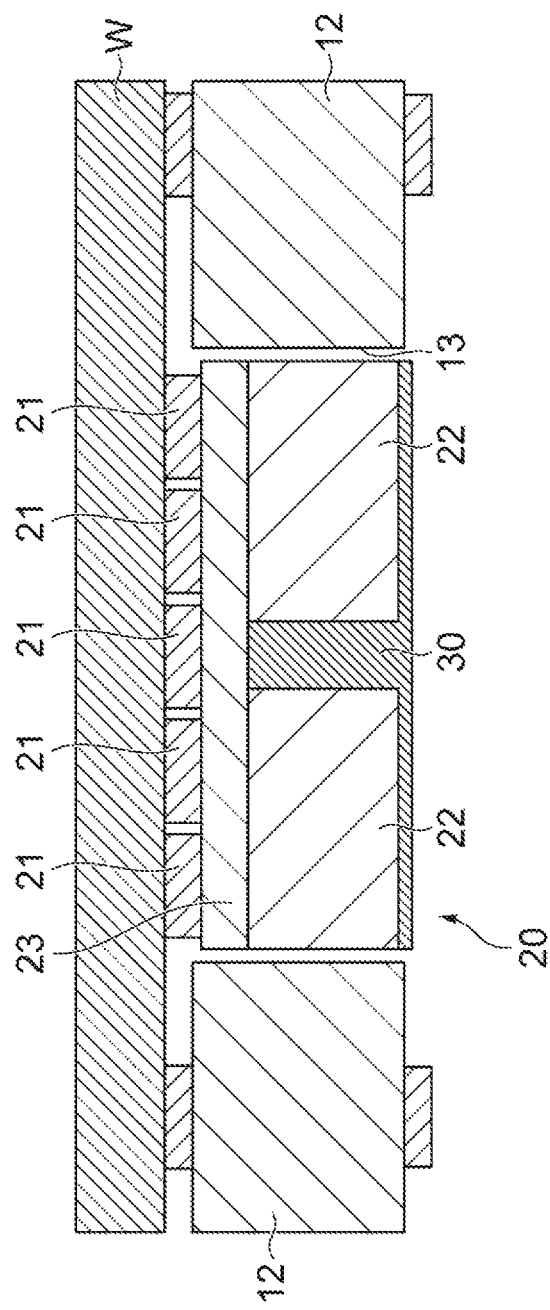
FIG. 8 is a view for describing the method for manufacturing the electronic component embedded substrate illustrated in FIG. 6.
Figure 9:
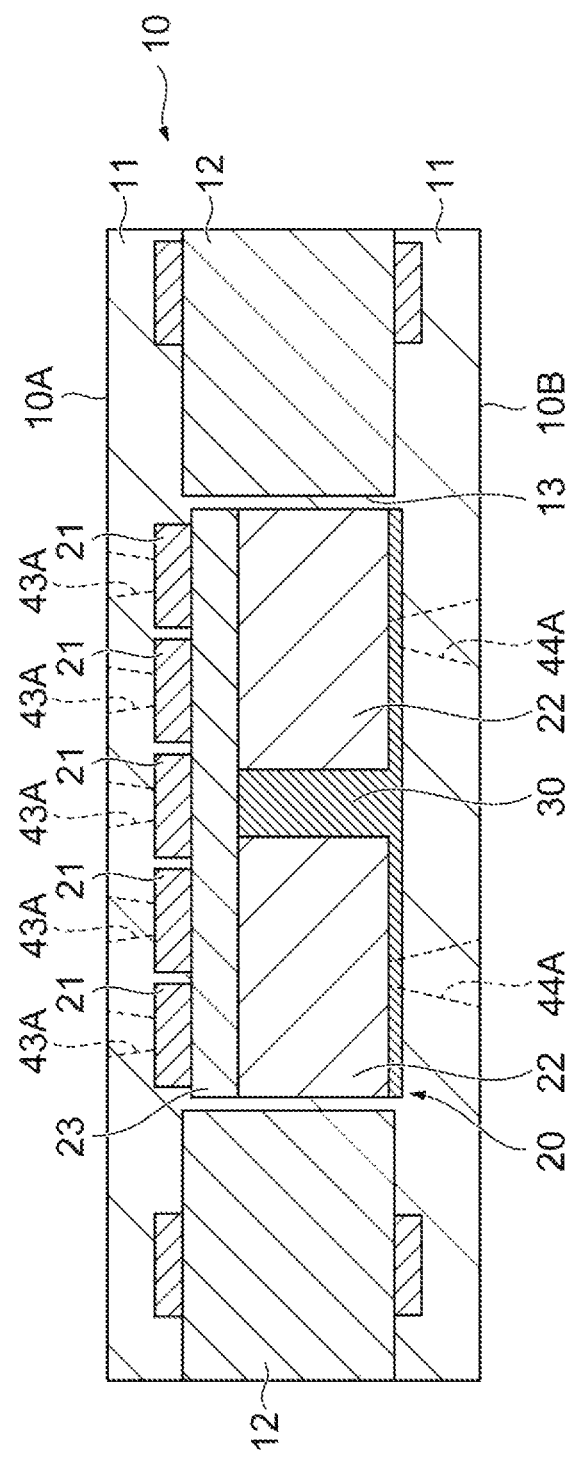
FIG. 9 is a view for describing the method for manufacturing the electronic component embedded substrate illustrated in FIG. 6.

Next, a method for manufacturing the electronic component embedded substrate 2 will be described with reference to FIGS. 7 to 9. FIGS. 7 to 9 are views for describing a method for manufacturing the electronic component embedded substrate illustrated in FIG. 6. In FIGS. 7 to 9, a method for manufacturing one electronic component embedded substrate 2 is illustrated. However, in practice, after a plurality of electronic component embedded substrates 2 are formed on a single support substrate, the electronic component embedded substrates 1 are individually segmented. Accordingly, FIGS. 7 to 9 are enlarged views illustrating a part on the single support substrate.

First, as illustrated in FIG. 7, the core 12 in which the through-hole 13 is provided is prepared. The electronic component 20 illustrated in FIG. 2 is prepared. The through-hole 13 may be formed using a known process such as, for instance, etching.

Next, as illustrated in FIG. 8, the core 12 is temporarily fixed to a support substrate W, and the electronic component 20 is disposed and temporarily fixed in the through-hole 13 of the core 12. As the support substrate W, for example a mounting temporary fixture or the like having stickiness may be used.

Next, as illustrated in FIG. 9, the insulating layer 11 is formed. The insulating layer 11 is formed, for instance, by applying a resin material in an uncured state to the core 12 and the electronic component 20 that are temporarily fixed to the support substrate W, and removing the support substrate W after the resin material is cured. Thereby, the core 12 and the electronic component 20 are in a state in which they are embedded in the insulating layer 11.

Finally, the holes 43A and 44A for forming the first via conductors 43 and 44 are formed in the first and second principal surfaces 10A and 10B. Afterward, the conductive layers are formed to embed the holes 43A close to the first principal surface 10A and the holes 44A close to the second principal surface 10B, and patterning is performed. Thereby, the first electrodes 41, the second electrodes 42, and the via conductors 43 and 44 are formed, and the electronic component embedded substrate 2 illustrated in FIG. 6 is obtained.

As described above, since the electronic component embedded substrate 2 is different from the electronic component embedded substrate 1 in that the substrate 10 further includes the core 12, the electronic component embedded substrate 2 can also obtain the same effects as the electronic component embedded substrate 1. That is, in the electronic component embedded substrate 2, the electronic component 20 has the plurality of second terminals 22, and the insulating member 30 that is in contact with both of the neighboring second terminals 22 and is formed of a material different from that of the insulating layer 11 is provided between the neighboring second terminals 22. Thereby, in comparison with a case in which the insulating member 30 is not provided, the second terminals 22 can be held by the insulating member 30 to inhibit deformation of the electronic component 20 due to internal stress and an external force in the electronic component embedded substrate 2. Accordingly, a reduction in strength of the electronic component 20 can be inhibited, and damage to the electronic component 20 can be inhibited. The insulating member 30 is provided between the neighboring second terminals 22, and thereby a short circuit between the second terminals 22 can be inhibited.

In the electronic component embedded substrate 2, the substrate 10 further includes the core 12 embedded in the insulating layer 11, the through-hole 13 passing from the first principal surface 10A side to the second principal surface 10B side is provided in the core 12, and the electronic component 20 is disposed in the through-hole 13. Thereby, in comparison with a case in which the substrate 10 includes only the insulating layer 11, a strength of the substrate 10 can be increased by the core 12. Accordingly, strength of the entire electronic component embedded substrate 2 can be improved.

While embodiments of the present invention have been described, the present invention is not limited to the above embodiments, and can be variously modified.

Figure 10:
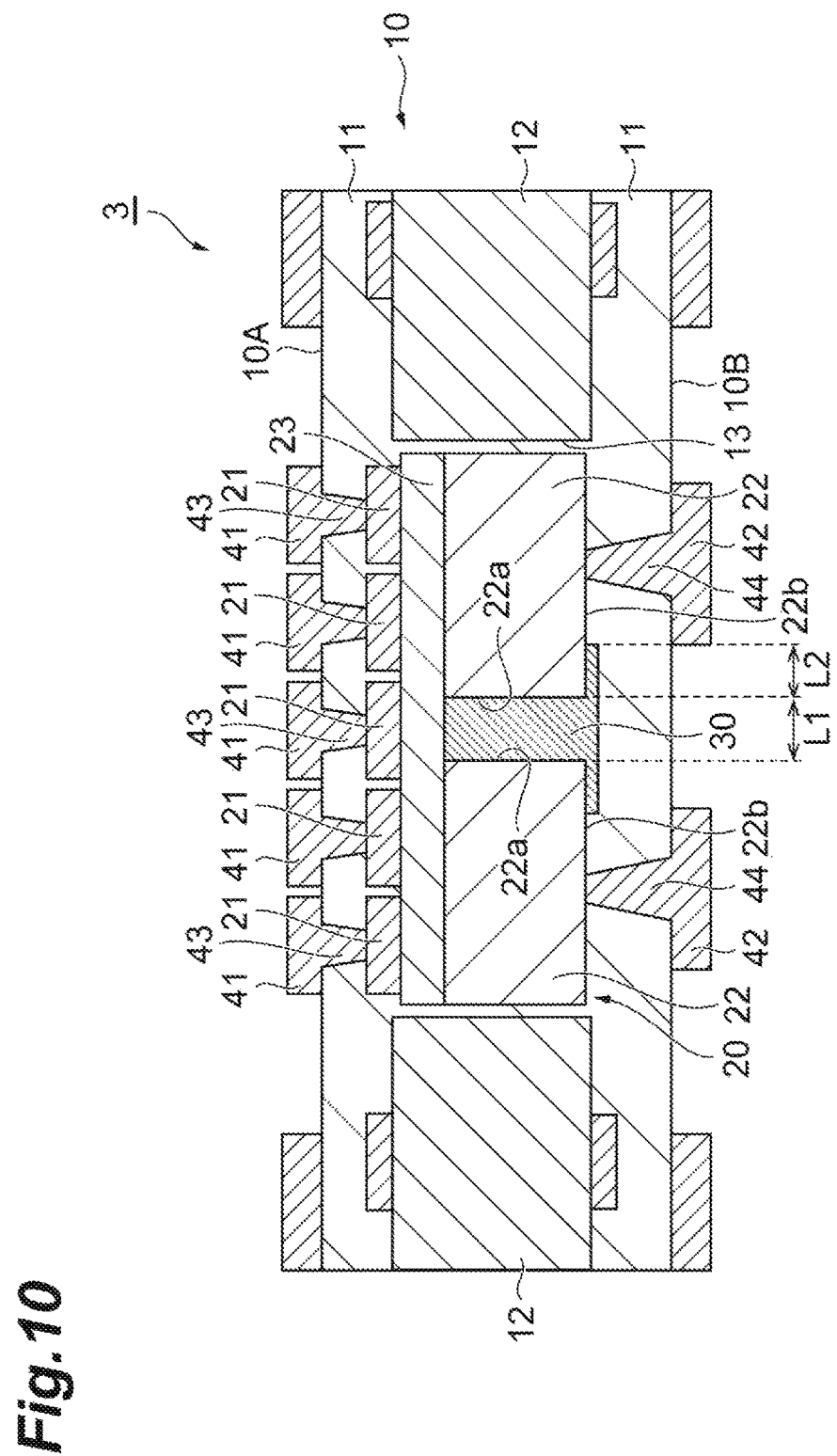
FIG. 10 is a sectional view schematically illustrating a part of an electronic component embedded substrate according to a modification.

In the above embodiments, the insulating member 30 is configured to cover all the end faces 22b of the second terminals 22, but the insulating member 30 may not cover all the end faces 22b. FIG. 10 is a sectional view schematically illustrating a part of an electronic component embedded substrate according to a modification. As in an electronic component embedded substrate 3 illustrated in FIG. 10, an insulating member 30 may be provided to cover only a part of each end face 22b. In this case, when a distance between neighboring second terminals 22 is defined as L1, and a length of the insulating member 30 provided on the end face 22b of one of the second terminals is defined as L2, a value of L2/L1 is preferably greater than 1.1. In this case, adherability between the second terminals 22 and the insulating member 30 can be further improved.

The insulating member 30 need only be provided at least between end faces 22a of the neighboring second terminals 22, and need not cover the end faces 22b of the second terminals 22. Further, the insulating member 30 may be provided along the end faces 22a of the second terminals 22 and a surface of the capacity part 23 which is exposed between the neighboring second terminals 22 without being filled between the neighboring second terminals 22.

Figure 11:
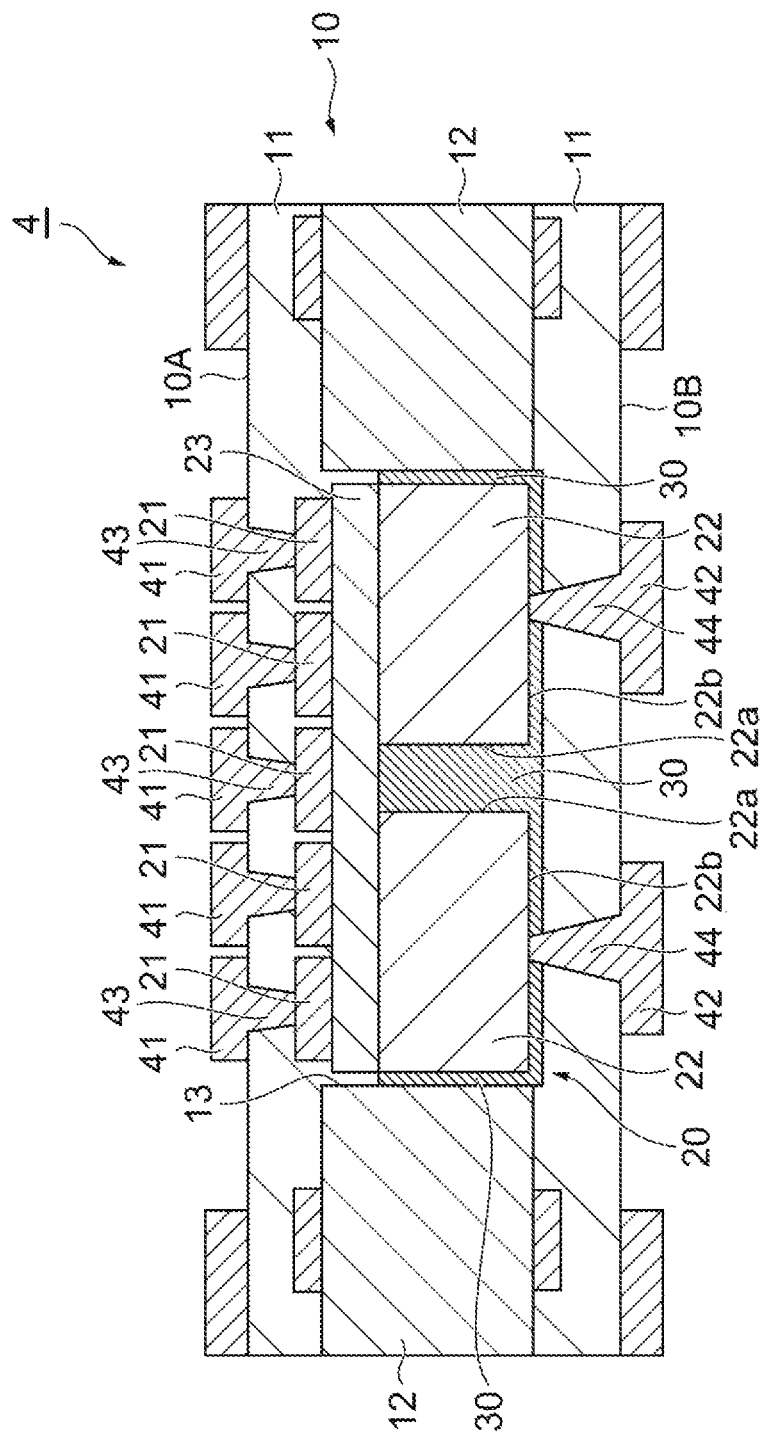
FIG. 11 is a sectional view schematically illustrating a part of an electronic component embedded substrate according to another modification.

In the electronic component embedded substrate, the insulating member 30 may also be provided between a core 12 and the second terminals 22 for the purpose of relaxing stress resulting from a difference in thermal expansion coefficient. FIG. 11 is a sectional view schematically illustrating a part of an electronic component embedded substrate according to another modification. As in an electronic component embedded substrate 4 illustrated in FIG. 11, an insulating member 30 is also provided on end faces of second terminals 22 which face a core 12 in addition to between neighboring second terminals 22 and end faces 22b of the second terminals 22. In this case, since an amount of an insulating layer 11 interposed between the core 12 and the second terminals 22 can be reduced, it is possible to further relax stress resulting from a difference between a thermal expansion coefficient of a material of which the insulating layer 11 is formed and a thermal expansion coefficient of a material of which the second terminals 22 are formed.

A sintering treatment may be performed on the second terminals 22. Thereby, in comparison with a case in which the sintering treatment is not performed, surface roughnesses of the end faces 22a and 22b of the second terminals 22 can be increased. Therefore, due to an anchor effect, adherability between the second terminals 22 and an insulating member 30 can be improved.

In the above embodiments, with regard to the electronic component 20 in the electronic component embedded substrate, the example in which the first terminals 21 are divided to be five terminals and the second terminals 22 are divided to be two terminals has been described. However, the first terminals 21 and the second terminals 22 need only be divided to be a plurality of terminals, and the number and shapes of the terminals are not limited to the above embodiment and can be appropriately modified. When the second terminals 22 are divided to be two or more terminals, the insulating member 30 may be provided between the neighboring second terminals 22 for all the second terminals 22, or the insulating member 30 may be provided between the neighboring second terminals 22 for only some of the second terminals 22. Even when the insulating member 30 is provided for only some of the second terminals 22, it is possible to obtain an effect of inhibiting the reduction of the strength of the electronic component 20 and an effect of inhibiting the damage to the electronic component 20.

What is claimed is:

1. An electronic component embedded substrate comprising:
   a substrate configured to include an insulating layer and to have a first principal surface and a second principal surface on the opposite side of the first principal surface; and
   an electronic component embedded in the substrate and configured to have a plurality of first terminals provided close to the first principal surface, a plurality of second terminals provided close to the second principal surface, and a capacity part provided between the plurality of first terminals and the plurality of second terminals,
   wherein
   the electronic component is configured such that at least a part of the second terminals is embedded in the insulating layer,
   an insulating member is provided between the neighboring second terminals to be in contact with both of the neighboring second terminals,
   the insulating member and the insulating layer are formed of materials whose thermal expansion coefficients are different from each other, and
   the thermal expansion coefficient of the material of which the insulating member is formed is smaller than that of the material of which the insulating layer is formed, and is greater than that of a material of which the second terminals are formed.

2. The electronic component embedded substrate according to claim 1, wherein:
   the insulating member is provided close to the second principal surface with respect to the second terminals.

3. The electronic component embedded substrate according to claim 2, wherein:
   the substrate further includes a core embedded in the insulating layer;
   a through-hole passing from the first principal surface side to the second principal surface side is provided in the core; and
   the electronic component is disposed in the through-hole.

4. The electronic component embedded substrate according to claim 1, wherein:

the substrate further includes a core embedded in the insulating layer;
a through-hole passing from the first principal surface side to the second principal surface side is provided in the core; and
the electronic component is disposed in the through-hole.

* * * * *